US008489905B2

(12) United States Patent
Smith, III et al.

(10) Patent No.: US 8,489,905 B2
(45) Date of Patent: Jul. 16, 2013

(54) METHOD AND SYSTEM FOR BUILDING A LOW POWER COMPUTER SYSTEM

(75) Inventors: Townsend Jackson Smith, III, McKinney, TX (US); Vihar Ramnath Rai, Cedar Park, TX (US); William Ernest Mapp, III, McKinney, TX (US)

(73) Assignee: Servergy, Inc., Plano, TX (US)

( * ) Notice: Subject to any disclaimer, the term of this patent is extended or adjusted under 35 U.S.C. 154(b) by 0 days.

(21) Appl. No.: 13/556,418

(22) Filed: Jul. 24, 2012

(65) Prior Publication Data
US 2013/0031390 A1 Jan. 31, 2013

Related U.S. Application Data

(60) Provisional application No. 61/511,376, filed on Jul. 25, 2011.

(51) Int. Cl.
G06F 1/32 (2006.01)
(52) U.S. Cl.
USPC .......................................................... 713/320
(58) Field of Classification Search
None
See application file for complete search history.

(56) References Cited

U.S. PATENT DOCUMENTS

| | | | |
|---|---|---|---|
| 6,501,999 B1 | 12/2002 | Cai | |
| 6,986,066 B2 | 1/2006 | Morrow et al. | |
| 6,996,070 B2 * | 2/2006 | Starr et al. | 370/252 |
| 7,366,921 B2 | 4/2008 | Ranganathan | |
| 7,450,963 B2 | 11/2008 | Krishnan et al. | |
| 7,627,770 B2 | 12/2009 | Jones | |
| 7,774,630 B2 | 8/2010 | Hatasaki et al. | |
| 7,783,909 B2 | 8/2010 | Hatasaki et al. | |
| 7,793,092 B2 | 9/2010 | Toi et al. | |
| 7,827,423 B2 | 11/2010 | Sutardja et al. | |
| 7,925,900 B2 | 4/2011 | Parks et al. | |
| 2004/0202534 A1 | 10/2004 | Inoue | |
| 2005/0055540 A1 * | 3/2005 | Hass et al. | 712/214 |
| 2007/0007823 A1 | 1/2007 | Huang et al. | |
| 2008/0111534 A1 | 5/2008 | Ravichandran | |
| 2008/0178025 A1 | 7/2008 | Hand et al. | |
| 2010/0162016 A1 | 6/2010 | Yang et al. | |
| 2011/0026532 A1 * | 2/2011 | Rojas-Cessa et al. | 370/401 |
| 2011/0055434 A1 | 3/2011 | Pyers et al. | |
| 2012/0116590 A1 * | 5/2012 | Florez-Larrahondo et al. | 700/275 |

FOREIGN PATENT DOCUMENTS
WO 2008038235 A2 4/2008

OTHER PUBLICATIONS

International Search Report and Written Opinion issued Oct. 29, 2012 in International Application No. PCT/US2012/047925 filed Jul. 24, 2012.

* cited by examiner

Primary Examiner — Kim Huynh
Assistant Examiner — Vincent Chang

(57) ABSTRACT

Various embodiments disclosed herein relate to an efficient computer server system comprising an efficient power supply unit utilizing a plurality of power-rails to supply electric power to the system components, a special-purpose processor configured to operate as an efficient general purpose server processor while maintaining high performance, and a platform manager configured to control the power supplied to the system components to minimize the system's overall power consumption. Some disclosed embodiments relate to a method of reducing power consumption in information handling server systems comprising configuring a special-purpose processor to be function as a general purpose server processor, selecting a set of power efficient system components based on performance and power efficiency, utilizing an efficient power supply unit and a platform manager to control the power supplied by the power supply unit, and adjusting the processor's frequency to achieve an optimal performance/power-consumption ratio.

15 Claims, 12 Drawing Sheets

METHOD AND SYSTEM FOR BUILDING A LOW POWER COMPUTER SYSTEM

CROSS REFERENCE TO RELATED APPLICATIONS

This application claims the benefit of and priority to U.S. Provisional Patent Application Ser. No. 61/511,376, filed on Jul. 25, 2011, entitled "Method and System for Building a Low Power Computer System," which is incorporated herein by reference in its entirety.

STATEMENT REGARDING FEDERALLY FUNDED RESEARCH

Not Applicable

NAMES OF THE PARTIES TO A JOINT RESEARCH AGREEMENT

Not Applicable

SEQUENCE LISTING, TABLE OF COMPUTER REFERENCE AND INCORPORATION THEREOF

Not Applicable

FIELD OF TECHNOLOGY

At least some embodiments of the disclosure relate to reducing power consumption in devices that utilize information processing components (e.g., microprocessor or a microcontroller), such as computer systems. Also, some embodiments of the disclosure relate to the reduction of size, and/or the reduction or dissipation of heat generated by devices that utilize information processing components.

BACKGROUND

Computers systems are programmable machines designed to sequentially execute sets of logical or arithmetic operations. Some computer systems, such as personal computers or smart phones, may be designed to flexibly meet an end-user's needs. Other computer systems may be designed to perform a few specific tasks, such as computer systems utilized in operating traffic lights, digital watches, or toys.

The modern world, characterized by the arrival of the information age, is a world of an increasing utilization of computer systems, as well as a growing desire and need for improvements in computer systems. Today's world however, is also a world of increased awareness of the issues relating to natural resources' scarcity and the mankind's adverse impact on the environment. The evolution of computer systems fits neatly into this paradox as the increasing usage of computer systems, and the improved performance of such systems, translates into an increased consumption of power and an adverse impact on the environment.

To help meet the processing capabilities necessary to process growing amounts of digital data associated with executing today's increasingly complex and demanding computer applications without sacrificing performance, improved computer system processing units were invented. For example, various multi-purpose, programmable, clock-driven integrated circuits, such as 8-, 16-, 32-, 64-bit microprocessors (e.g., INTEL® 8008, 8086, 80286, ITANIUM®, etc.) were developed. Alongside the improvements in microprocessor word length capacities were significant advancements in microprocessor clock frequency limits.

The above-mentioned improvements in computer system processing capabilities, as well as other such improvements in general, lead to an increase in power consumption by the system. Also, there are limits on how much the performance of a single processor can be improved. For example, increasing the clock frequency of a microprocessor not only leads to a higher power consumption in the computer system utilizing it, but also results in an increased generation of heat, which can in turn interfere with the processor's normal working conditions.

The preferred embodiments of the systems and methods disclosed herein serve to fill the need for building computer systems capable of meeting and exceeding the modern world's stringent performance requirements while achieving unparalleled power consumption efficiencies and reducing the adverse footprint of using computer systems on the environment, for example, by reducing the heat generated by, or the size of the computer system.

SUMMARY

In accordance with various embodiments hereinafter described, are systems and methods of building or designing low power computer systems. One embodiment is a low power consumption general purpose computer server system comprising a motherboard used to interconnect the various system components. The system components comprise a power supply unit having several power-rails utilized to supply electric power to the system components, one or more peripheral boards, a main processor, and a platform manager. The main processor comprises a plurality of main processor cores, a memory controller, offload engines, an Ethernet interface, and a peripheral component interconnect block, operably interconnected through a connection fabric. The main processor further comprises a local bus connected between the connection fabric and other system components such as the platform manager. The platform manager is configured to control the power supplied by the power supply unit to the power rails. In one embodiment, the main processor is configured to offload predetermined processor tasks to the plurality of offload engines, and has a minimum COREMARK® score to Watts-consumed ratio of approximately 530 while operating under a maximum load i.e., while all processor cores are under maximum load, and maximum IO operations on interfaces such as disk access, Ethernet, and PCIe. In an embodiment, the main processor, configured to operate at a frequency of approximately 1.5 GHz and under a full load, has a COREMARK® score of approximately 45140 and consumes 85 Watts of power, thereby having a COREMARK® score/Frequency (MHz) ratio of approximately 30, and a COREMARK® score to Watts-consumed ratio of approximately 531. In this embodiment, the low power consumption general purpose computer server system is configured to consume a maximum of approximately 130 Watts of power while operating under a maximum load.

In accordance with some illustrative embodiments, the main processor is a communications processor system on a chip, configured to operate as a general purpose computer server processor, and the platform manager is based on a field programmable gate array (FPGA), the platform manager comprising a platform manager processor, platform manager cores, and a platform manager bus connected between the platform manager processor and the platform manager cores. In other embodiments, the platform manager is based on an application-specific integrated circuit (ASIC), an application-specific standard product (ASSP), or a Base Management controller (BMC) integrated circuit. In an embodiment, the platform manager processor is an ARM® processor, and the platform manager is configured by a platform manager software to control the power supplied by the power supply unit to the power rails. Some embodiments further comprise a plurality of system fans, wherein the platform manager is configured to control the system fans to maintain the system's temperature within a predetermined range. In one embodiment, the platform manager is configured to control the system fans to maintain a maximum idle main processor operating temperature of approximately 67 degrees Celsius, under an ambient temperature of approximately 25.5 degrees Celsius. In one embodiment, the platform manager is configured to control the system fans to maintain a maximum full-load processor operating temperature of approximately 77 degrees Celsius under an ambient temperature of approximately 25.5 degrees Celsius, while maintaining the system's overall power consumption under 130 Watts.

In some embodiments, the power supply unit has a minimum power efficiency of approximately 90%, and the platform manager is configured to control the power supplied to a minimum of 20 power rails such that the general purpose computer server system consumes a maximum of approximately 130 Watts of power while operating under a maximum load. In some embodiments, the platform manager further comprises a memory module connected to the platform manager processor to store and execute the platform manager software, a set of dedicated registers connected to the platform manager processor, and a set of shared registers connected between the platform manager processor and the main processor. In one embodiment, the set of shared registers comprise a revision register and a reset request register, and the set of dedicated registers comprise a control register and a status register.

In one embodiment, a non-volatile memory component is operably connected between the main processor and the platform manager, the non-volatile memory component utilized to store boot software, board component and software configuration variables (e.g., initial settings, MAC addresses, and board IDs), and/or other software and firmware images utilized by the system components. In some embodiments, the non-volatile memory component is also utilized to store the operating system software and in other embodiments, the operating system software is stored on the system's main memory module and/or the non-volatile memory component. In one embodiment, the operating system software comprises a first diagnostics software and a first system management software, and the boot level software comprises a BIOS menu, a second diagnostics software, and a second system management software.

In accordance with other illustrative embodiments is a general purpose server computer system comprising a repurposed communications processor having a minimum COREMARK® score to Watts-consumed ratio of approximately 530 while operating at a frequency of 1.5 GHz and under a maximum load, a power supply unit having at least 90% power efficiency, the power supply unit comprising a plurality of power rails, and a platform manager configured to control the power supplied to the power rails, wherein the computer system is configured to consume less than approximately 130 Watts while operating under a maximum load i.e., while all processor cores are under maximum load, and maximum JO operations on interfaces such as disk access, Ethernet, and PCIe. In one embodiment, the platform manager is based on a field programmable gate array (FPGA), and comprises a platform manager processor, a plurality of platform manager cores, and a platform manager bus connected between the platform manager processor and the platform manager cores. One embodiment further comprises a non-volatile memory component operably connected between the repurposed communications processor and the platform manager which is utilized to store an operating system having a first diagnostics software and a first system management software, and a boot software having a BIOS menu, a second diagnostics software, and a second system management software.

In accordance with yet other illustrative embodiments is a method of building a low power computer system comprising repurposing a special-purpose processor, such as a communications processor, to be utilized as a general purpose server processor, the special purpose processor having a plurality of processor cores, ports, and offload engines, selecting a set of system components based on performance and power efficiency, removing the processor's unused ports, utilizing a power supply unit having a minimum power efficiency of approximately 90%, utilizing a platform manager to control the power supplied by the power supply unit to the set of system components through a plurality of power rails, and adjusting the processor's frequency to achieve a maximum performance per power-consumption ratio. One embodiment comprises adjusting the processor's frequency to achieve a minimum COREMARK® score per Watts-consumed ratio of approximately 530.

In accordance with still other illustrative embodiments is a general-purpose computer that consumes less than 130 Watts of power while under full load, i.e., while all processor cores are under maximum load, and maximum IO operations on interfaces such as disk access, Ethernet, and PCIe. In another embodiment, the computer system may be an Industry Standard Server computer, and may comprise a processor, which may be a repurposed processor having at least eight (8) cores, an efficient power supply unit, and a platform manager, the processor consuming less than approximately 85 Watts of power while operating at a frequency of 1.5 GHz and under a full load. In an embodiment, the processor may have a minimum COREMARK® score to Watts-Consumed ratio of approximately 500. The COREMARK® score, which is a generic benchmark specifically targeted at the processor core, was developed by the Embedded Microprocessor Benchmark Consortium (EEMBC®). The COREMARK® scores for the embodiments disclosed herein were determined using EEMBC's COREMARK® 1.0 Benchmark Scores software.

In accordance with another illustrative embodiment of the computer system, is an Industry Standard LAMP (Linux, Apache, MySQL, PHP) Server that consumes less than 130 Watts of power while under full load, i.e., while all processor cores are under maximum load, and maximum IO operations on interfaces such as disk access, Ethernet, and PCIe. The server may comprise a repurposed processor, which may be a communications processor. The server may further comprise a power supply with a 90% or more power efficiency. The server may also comprise a platform manager, which may be based on a Field Programmable Gate Array integrated circuit (FPGA), an application-specific integrated circuit (ASIC), an application-specific standard product (ASSP), or a Base Management controller (BMC) integrated circuit and may be utilized to enable (ON) or disable (OFF) system components, such as fans.

In accordance with yet another illustrative embodiment of the computer system, is a Industry Standard LAMP (Linux, Apache, MySQL, PHP) Server based on a repurposed communications processor that consumes less than 130 Watts of power while operating at the processor frequency of 1.5 GHz while all cores are under maximum load, and maximum IO operations on interfaces such as disk access, Ethernet, and PCIe. The communications processor may comprise one or more offload engines. The server may further comprise a power supply with a 90% or more power efficiency, and a platform manager, which may be utilized to enable (ON) or disable (OFF) system components, such as fans.

In accordance with another illustrative embodiment of the computer system, is an Industry Standard LAMP (Linux, Apache, MySQL, PHP) Server based on a repurposed communications processor that may comprise of one or more offload engines, the server further comprising an efficient power supply unit and a platform manager. The power supply may be 90% or more efficient, and the platform manager may be a FPGA-based circuit utilized to enable (ON) or disable (OFF) system components, such as fans, and provide different power levels to one or more of the system's power rails.

In accordance with another illustrative embodiment of the computer system is a general purpose server computer comprising at least ten (10) or more power rails each powered up to a predetermined level by the computer's platform manager. The platform manager may be a FPGA-based integrated circuit utilizing a dedicated processor, which may be an ARM® processor.

In accordance with yet another illustrative embodiment of the computer system, is a general purpose server computer comprising one or more fans, and a platform manager that controls the fans. The server computer may further comprise a repurposed communication processor, and a power supply unit. In one embodiment, the server computer may comprise an eight-core communications processor which, while operating under an ambient temperature of 25.5° C., may operate at an idle temperature of approximately 67° C., or a full load temperature of approximately 77° C., i.e., while all cores are under maximum load, and maximum IO operations on interfaces such as disk access, Ethernet, and PCIe. In some embodiments, the server computer comprises a small form factor that would enable the placement of two or more servers in a standard 1U server rack. For example, one embodiment comprises a form factor having (Width×Length×Height) dimensions of 8.5×14×1.75 inches, which enables the side-by-side placement of two servers in a 19 inch wide 1U server rack, which in turn has an inside width of 17.5 inches, with the system tray and slides accounting for the 0.5 inch differential between the width of the two servers and the rack.

In accordance with illustrative embodiments of the method of building a low power general purpose computer system, is a method comprising the steps of repurposing a special-purpose processor to operate as a general purpose processor, selecting the most power efficient components for the system, and utilizing a platform manager. In one embodiment, the low power general purpose computer system may be a general purpose server computer, such as an Industry Standard LAMP Server. In another embodiment, the special-purpose processor, which may be a communications processor, and may be repurposed to operate as a general-purpose server processor. Yet another embodiment may further comprise the step of utilizing one or more of the processor's offload engines to perform a particular task (such as network data path acceleration, database query offloading, video transcoding) to further increase the efficiency of the system by releasing the processor to complete other tasks.

In accordance with illustrative embodiments of the method of building a low power general purpose server computer system, is a method comprising the steps of repurposing a communications processor to operate as a general purpose server processor, selecting the most power efficient components for the system, removing the unused processor ports, utilizing a platform manager, and adjusting a processor's CPU frequency to achieve the highest performance per watts-consumed ratio.

DETAILED DESCRIPTION

Figure 1:
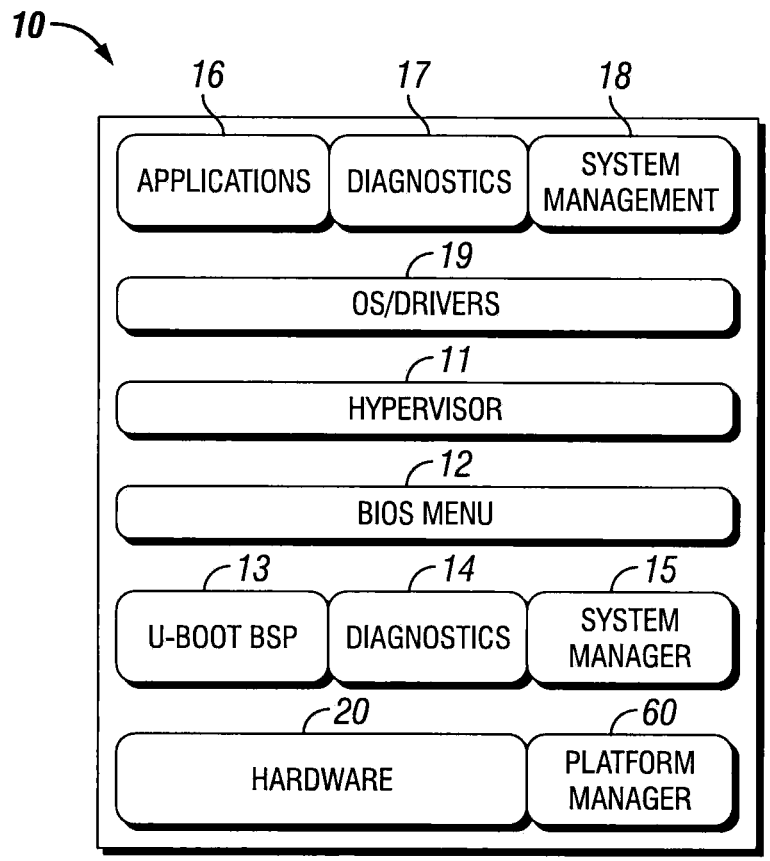
FIG. 1 is component block diagram illustrating a low power computer system according to one embodiment of the present invention.

Detailed embodiments of the present system and methods are disclosed herein; however, it is to be understood that the disclosed embodiments are merely illustrative of the system and methods that may be embodied in various forms. In addition, each of the examples given in connection with the various embodiments of the systems and methods are intended to be illustrative, and not restrictive. Further, the drawing figures are not necessarily to scale, some features may be exaggerated to show details of particular components. In addition, any measurements, specifications and the like shown in the figures are intended to be illustrative, and not restrictive. Therefore, unless clearly stated otherwise, specific structural and functional details disclosed herein are not to be interpreted as limiting, but merely as a representative basis for teaching one skilled in the art to variously employ the present invention. Moreover, power usage and temperature measurements can be taken using standard equipment and methodology such as, for example, with a Valhalla Digital power analyzer and a Apevia Power Supply tester (e.g., Model ATX-1B680W) connected in series with an illustrative embodiment, and a thermocouple grid (e.g., an approximately one-inch by one-inch a thermocouple grid).

FIG. 1 illustrates a high-level component diagram of a preferred embodiment with the embodiment being a general purpose computer system 10. In a preferred embodiment, the computer system is a server computer. The Hypervisor 11, BIOS Menu 12, U-Boot BSP 13, boot-level diagnostics 14, and boot-level system manager 15 software may comprise the boot level software running on the system. The Applications 16, Diagnostics 17, System Management 18, and OS/Drivers 19 software may comprise the operating system (OS) level software running on the computer system.

Figure 2A:
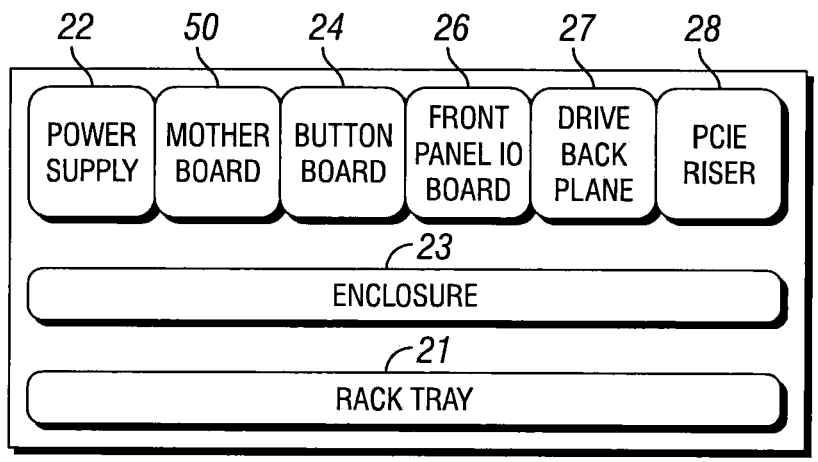
FIG. 2A illustrates a high-level hardware component diagram according to an embodiment of the present invention.
Figure 2B:
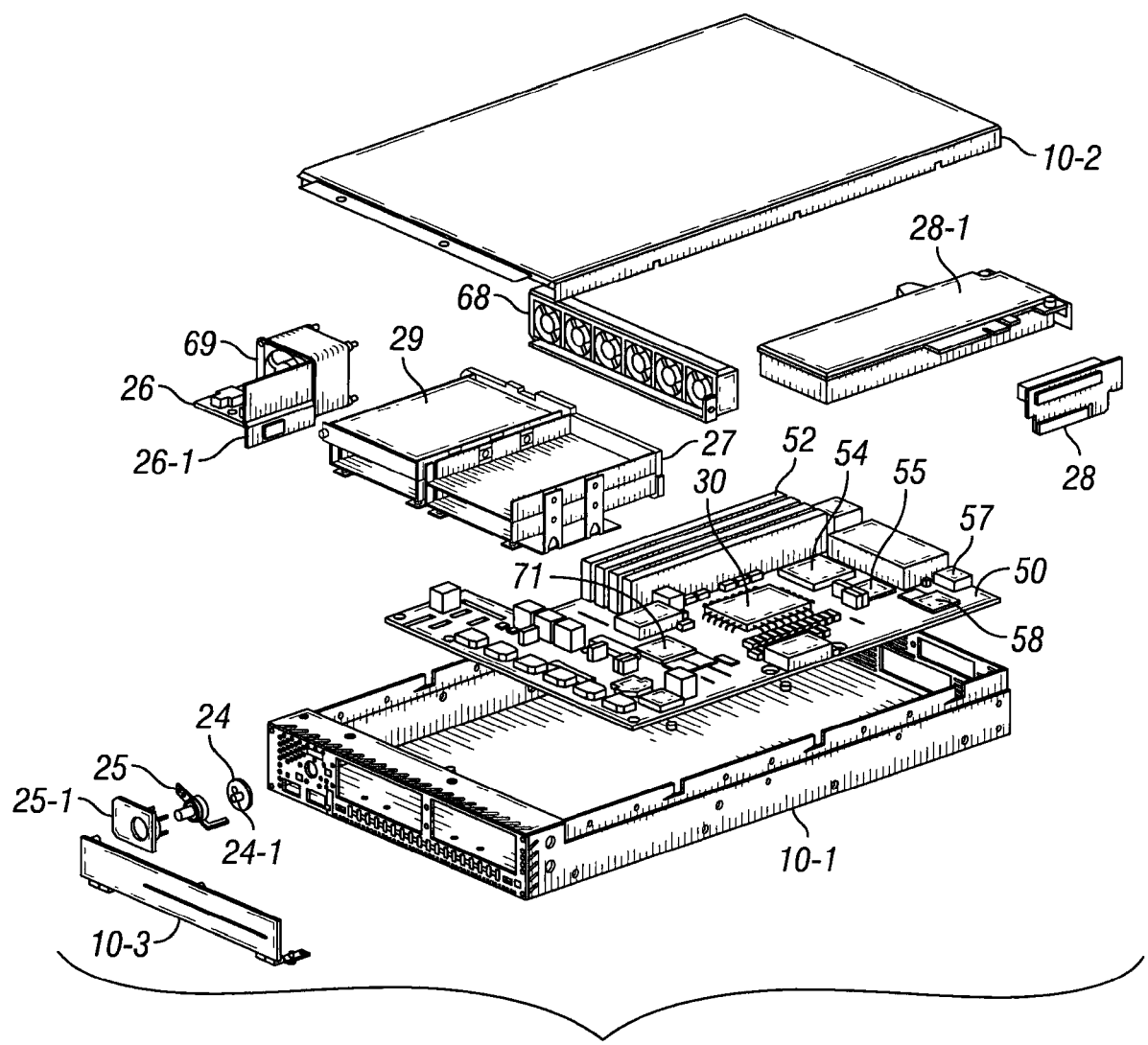
FIG. 2B illustrates an exploded side level view of the hardware components utilized in the design of an embodiment of the present invention.

As illustrated in more detail in FIGS. 2A and 2B, the Hardware block 20 represents various hardware components that may comprise an embodiment of a low power computer system. The platform manager 60, illustrated in more detail in the embodiments of FIGS. 4, 5, 6, and 7, manages the processor 30 initialization, system debug, system security, controls and monitor power supply unit 22, monitors the system's temperature, or controls one or more of the system fans 68 or 69.

FIGS. 2A and 2B further illustrate a hardware component block diagram and an exploded side view of a preferred embodiment, respectively. The mother board 50 may be a printed circuit board (PCB). The computer system 10 may utilize a power supply unit (PSU) 22 which may comprise of a high efficiency AC to DC circuit connected to the mother board 50 through a connector. In a preferred embodiment, the power supply is a switch mode 110-240 Volt AC ($V_{AC}$) to 12 Volt DC ($V_{DC}$) power supply which may provide 12 $V_{DC}$ at the main output rail, the standby output, and input/out (I/O) signals, while providing a continuous non-derated maximum output power capability of approximately 206 Watts over the operational temperature range of 0° to 45° Celsius. In one embodiment, the PSU 22 has 90% power efficiency at 180 Watts output loading at the 12 $V_{DC}$ main output rail. The button board 24 may comprise of one or more LED's 24-1 which may be used to illuminate the power button 25 according to the current state of the computer system. The preferred embodiment utilizes a front panel I/O board 26 as the interface between the mother board 50 and any front panel USB ports, and may have the drivers for the button board 24 and the power button 25. In a preferred embodiment, front panel I/O board 26 is connected or secured to a housing 26-1 utilized to house other system components, such as a system fan 69. One embodiment also utilizes a drive back plane 27 as the interface between the mother board 50 and the hard disk drive 29. Moreover, the preferred embodiment may utilize a PCIe riser 28. In one embodiment, the PCIe riser 28 may be connected to the mother board 50 at a 90° angle, allowing the peripheral board 28-1 connected to the PCIe riser slot 28 to be parallel to the mother board 50, thus further reducing the vertical profile of the computer system. In another embodiment, the power button may be housed in a power button housing 25-1 which may control the access to the power button, and the components of the computer system 10 may be housed in a housing 10-1 which may be attached to a removable cover 10-2 and a front panel door module 10-3. In a preferred embodiment, the computer system 10 may be an Industry Standard LAMP Server based on a repurposed communications processor that consumes approximately 130 Watts of power while operating under a full load and at the processor frequency of 1.5 GHz.

Figure 3:
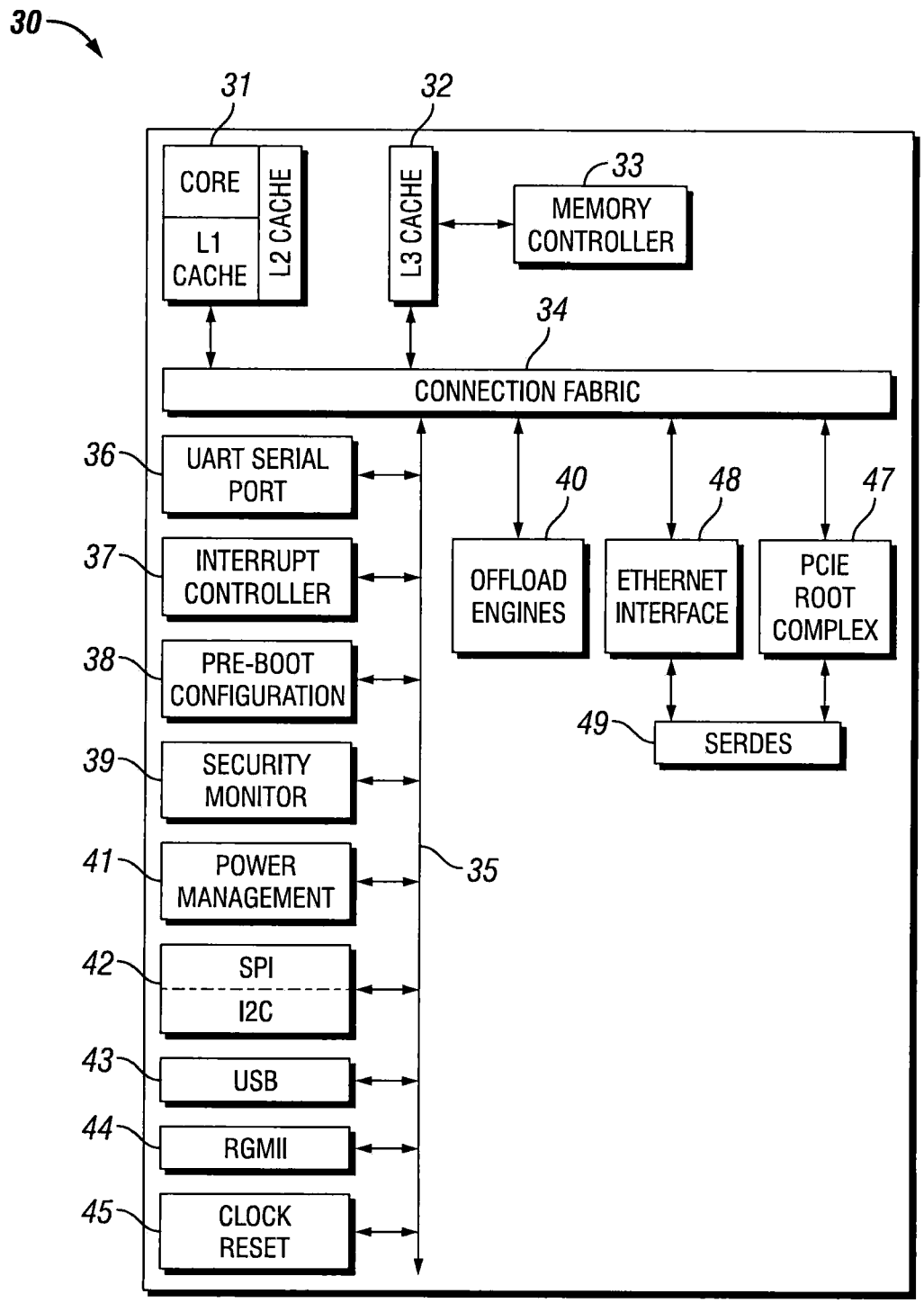
FIG. 3 is block diagram illustrating the components and the connection thereof of a computer processor that may be utilized in one embodiment of the present invention.

FIG. 3 illustrates a preferred embodiment which utilizes a system on a chip (SOC) processor 30 (i.e. having built-in peripheral interfaces). In the illustrated embodiment, the processor 30 is mechanically supported by and electronically connected to the mother board 50. The processor 30 comprises one or more processor cores 31, independent cache levels 31, 32, and a memory controller component 33 that manages the processor's connection or interface with the hard disk drive (HDD) 29. The processor 30 also comprises one or more offload engines 40 (e.g., for common operations such as pattern matching, encryption block algorithms, and buffer management), Ethernet interface components 48, Peripheral Component Interconnect Express (PCIe) root complex 47, and Serializer/Deserializer (SerDes) block 49. Moreover, the processor 30 comprises a connection fabric 34 to connect the processor core(s) 31 and memory controller 33 to offload engine(s) 40, PCIe root complex 47, Ethernet interface 48, or local bus 35. The local bus 35 may in turn be connected to other interfaces or components as needed, such as one or more universal asynchronous receiver/transmitter (UART) ports 36, interrupt controller interface 37, pre-boot configuration interface 38, security monitor interface 39, power management interface 41, Inter-Integrated Circuit ($I^2C$) and/or Serial Peripheral Interface (SPI) buses 42, USB interface 43, Reduced Gigabit Media Independent Interface (RGMII) 44, and/or a clock reset interface 45. In a preferred embodiment, the processor may be a communications processor, such as the FREESCALE™ Eight-Core P4080 Communications Processor. In another embodiment, the processor may be a repurposed processor that consumes less than 85 Watts of power while operating at a frequency of 1.5 GHz and under a full load. In an embodiment, the processor may be a repurposed communications processor having a minimum COREMARK® score to Watts-Consumed ratio of approximately 500. In one embodiment, the processor may be a repurposed communications processor having a COREMARK® score to Watts-Consumed ratio of approximately 530. The COREMARK® score, which is a generic benchmark specifically targeted at the processor core, was developed by the Embedded Microprocessor Benchmark Consortium (EEMBC®). As described on EEMBC's COREMARK® website (www.coremark.org), COREMARK® is comprised of ANSI C code with a realistic mixture of read/write operations, integer operations, and control operations. The workload used by COREMARK® is comprised of several commonly used algorithms that include matrix manipulation (to allow for the use of MAC and common math operations), linked list manipulation (to exercise the common use of pointers), state machine operation (common use of data dependent branches), and Cyclic Redundancy Check, which is a very common function used in embedded). The COREMARK® scores for the embodiments disclosed herein were determined using EEMBC's COREMARK® 1.0 Benchmark Scores software.

Figure 4:
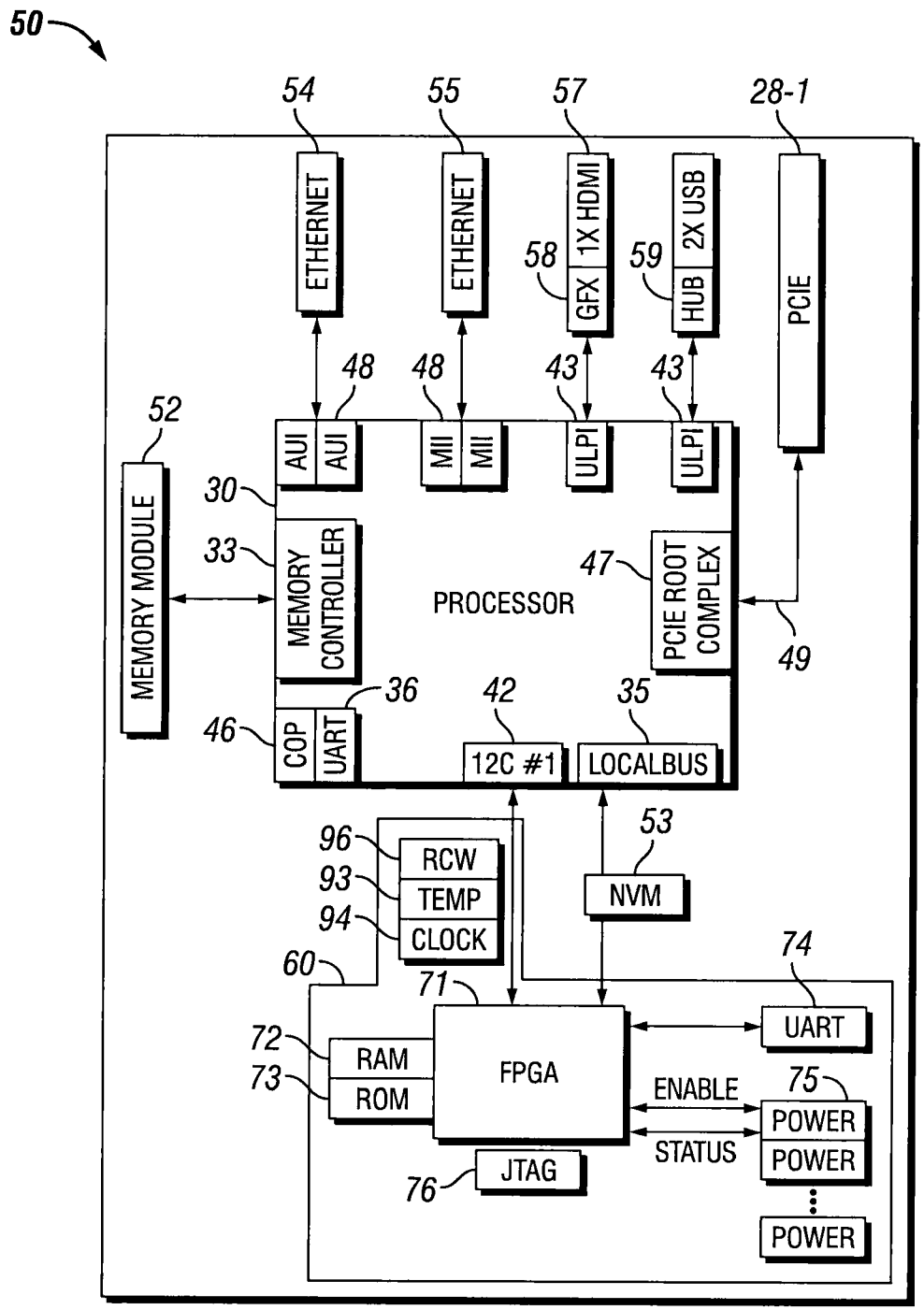
FIG. 4 is a mother board block diagram illustrating the components and the interactions thereof that may be utilized in one embodiment of the present invention.

As illustrated in FIGS. 2B and 4, the mother board 50 may be used to mechanically support and electronically connect a processor 30 to various components. The processor 30 may be interfaced with or connected to one or more memory modules 52. In a preferred embodiment, the memory module 52 may comprise one or more 64-bit Dual in-line memory module (DIMM) and may be interfaced with or connected to the processor 30 using one or more double data rate type three (DDR3) controllers 33. The processor 30 may also be interfaced with or connected to one or more Ethernet chips 54 and 55, and Peripheral Component Interconnect Express (PCIe) 28-1 components. In a preferred embodiment, the PCIe root complex 47 may be interfaced or connected with PCIe through a SerDes 49. In another preferred embodiment, the processor's Ethernet interface 48 may comprise one or more Attachment Unit Interface (AUI) (e.g, XAUI) which may be interfaced with or connected to one or more Ethernet PHY chips 54, and/or Media Independent Interfaces (MII) (e.g.

SGMII) which may be interfaced with or connected to one or more Ethernet transceivers 55. In one embodiment, the PHY chip 54 may be a TN2022 10G Dual Port and the Ethernet transceiver 55 may be a VSC8234 SGMII Dual Port. Furthermore, the USB interface 43 may comprise one or more ULPI interfaces which may be connected to and otherwise interfaced with a video display connector 57 (e.g., HDMI) using an adapter 58, and may be utilized to provide one or more system USB connectors using a HUB 59. In a preferred embodiment, the adapter 58 may be a DL 125 USB-DVI.

As also illustrated in FIG. 4, the mother board 50 may also be used to mechanically support and electronically connect the components of the platform manager 60 to a non-volatile memory (NVM) 53 and other system components. The NVM 53 may be utilized to store the boot and OS software for the processor 30, and may preferably be a NOR Flash memory type. In the exemplary embodiment illustrated in FIG. 4, the platform manager is based on a Field Programmable Gate Array integrated circuit (FPGA) 71. The FPGA 71 may reside on the local bus 35 of the processor 30, and may utilize a ROM 73 to store, and a RAM 72 to execute the platform manager's software 66. In one preferred embodiment, the NVM may be programmed to allow external data read through the platform manager's UART 74 be programmed into the NVM, thereby allowing the FPGA software 66 to verify, erase, or reprogram the content of the NVM 53. The platform manager 60 may comprise a JTAG bus which may be connected to the processor's debug port, which may be a Common On-Chip Processor (COP) debug port 46. The FPGA 71 may be connected one or more power rails 75, and may be used to enable or power up the power rails 75 and monitor the power status of the power rails.

Figure 5:
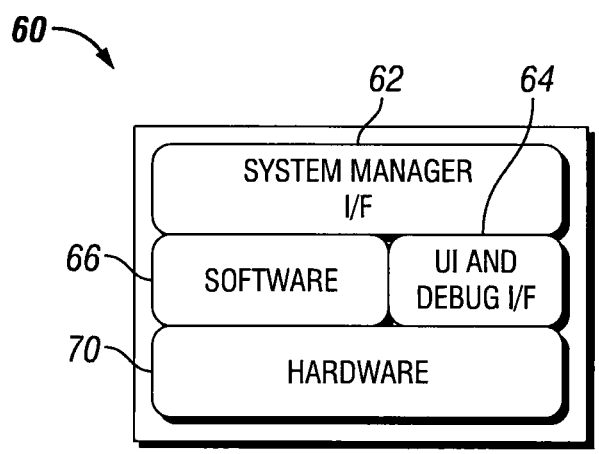
FIG. 5 is block diagram illustrating the various components of a platform manager that may be utilized in one embodiment of the present invention.
Figure 6:
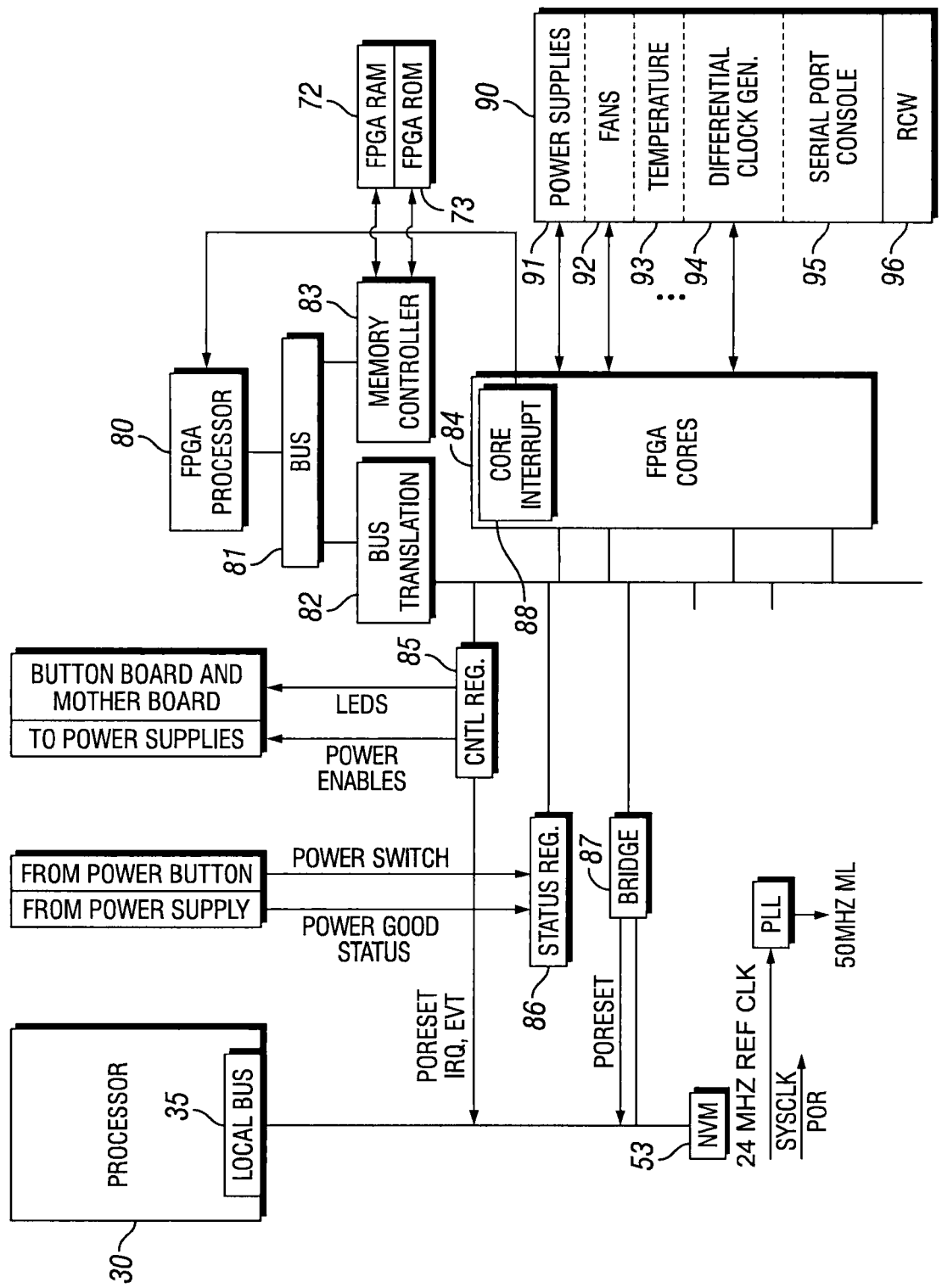
FIG. 6 is block diagram illustrating the various hardware components of a platform manager that may be utilized in one embodiment of the present invention.
Figure 7:
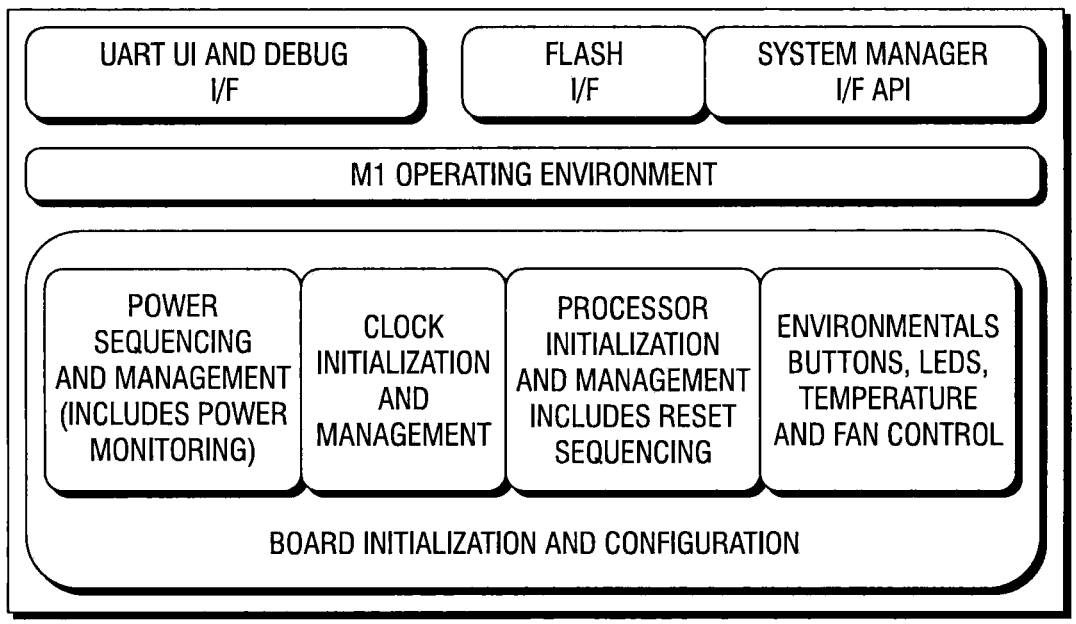
FIG. 7 is a block diagram of the various software and interfaces that may be utilized by the platform manager in one embodiment of the present invention.

FIGS. 5, 6, and 7 illustrate an exemplary embodiment of platform manager 60 based on a FPGA 71. FIG. 5 illustrates a high-level component block diagram of a preferred embodiment of the platform manager 60 which may comprise a system manager interface 62, UI and debug interface 64, software 66, and hardware 70 blocks.

FIG. 6 illustrates an example of a FPGA based platform manager 60 hardware blocks 70 as interfaced with or connected to various other components of the computer system 10. The platform manager FPGA 71 may comprise a processor 80. In one embodiment, the FPGA may be an ACTEL® M1A3P1000L FPGA, and the FPGA processor 80 may be an ARM® processor. The FPGA processor 80 may utilize a Bus 81 to connect to, or communicate or interface with other FGPA and system components, such as the FGPA memory controller 83. In a preferred embodiment, the Bus may be a AMBA High-performance Bus (AHB), which may utilize a Bus Translation component 82, such as a AHB-to-APB (Advance Peripheral Bus) translator, to facilitate the FPGA processor's interfacing or communication with the FPGA cores 84, the main processor 30, and various other system components. The FPGA cores 84 may comprise a core-interrupt that may send an interrupt signal to the FPGA processor 80 when appropriate, such as a change in status register 86. In a preferred embodiment, the FPGA may also comprise other interface cores 84, such as one or more SPI and I2C Bus interface, UART interface, a pulse-width-modulation (PWM) interface, a clock timer interface, and a system watch-dog interface to facilitate the FPGA processor's 80 connection, communication, or interface with other components controlled by the FPGA software 66 (not shown). In such an embodiment, the SPI bus interface may be utilized to enable the programming of the system's differential clock generator 94; the I2C bus interfaces may be utilized by the FPGA processor software 66 to monitor or control the temperature 93 and accordingly populate or update the FPGA registers, read the power supply unit's status 91, verify and/or update the Reset Configuration Word (RCW) 96, or program the clock 94. The pulse-width-modulation (PWM) interface may be utilized to control the speed of one or more of system's fans 68 or 69, and/or the color LEDs for the front panel LED 24-1. The Watchdog timer may be capable of resetting the FPGA processor's software core.

As further illustrated in the embodiments of FIGS. 4 and 6, the FPGA is interfaced with the main processor's local bus 35 through a bridge 87 to provide various functionalities, such as the PORESET functionality, FPGA read/write access to NVM 53, or communications between the main processor 30 and the PFGA processor 80. The bridge 87 comprises one or more address and data registers (not shown), which may be used by the FPGA processor 80 to set the address and data values for the next access to local bus 35.

The platform manager FPGA 71 utilize one or more register types; while some of the registers may be accessible only in the FPGA processor 80 space, others may also be made accessible in the main processor 30 space through a bridge 87. The FPGA registers shared with the main processor 30, such as revision and reset request registers, may be accessible to the main processor 30 through the local bus 35 similar to a regular memory, and may also be accessed by the FPGA for use or control of the FGPA software 66 execution. For example, the reset requester register may allow the main processor 30 to request reset of an external subsystem (e.g., PCIe, Ethernet PHY, etc.) by reading/writing the register directly, with the FPGA processor 80 interrupted when the register is rewritten, and the FPGA software 66 reading the register and handling the actual reset as appropriate. As illustrated in the embodiment of the FPGA-based platform manager of FIG. 6, the FPGA 71 implements one or more control registers 85 and status register 86 accessible only in the FPGA processor 80 space. In one embodiment, the majority of system control is handled by FPGA processor software 66, with at least one exception being RCW source application to the main processor's local bus 35, which occurs at the end of a system reset signal PORESET. The status register 86 is utilized to report status bits from throughout the system to the FPGA processor 80. The FPGA 71 is configured to utilize one or more control registers 85 to enable bits throughout the system, such as the power enable, clock enable, or memory write protect bit, to reset bits throughout the system, or to notify the main processor 30 of external events.

FIG. 7 illustrates block diagram of the various components or functions of the FPGA software 66. The software 66 may run when the system 10 is powered up but may hold everything in reset while awaiting a power button 25 press. Upon sensing a power button press, the software 66 may enable the various power rails 75 in a predetermined sequence and may initialize the platform manager components. The platform manager processor 71 may comprise a menu system through which the platform manager's hardware blocks 70 may be manually controlled.

Figure 8:
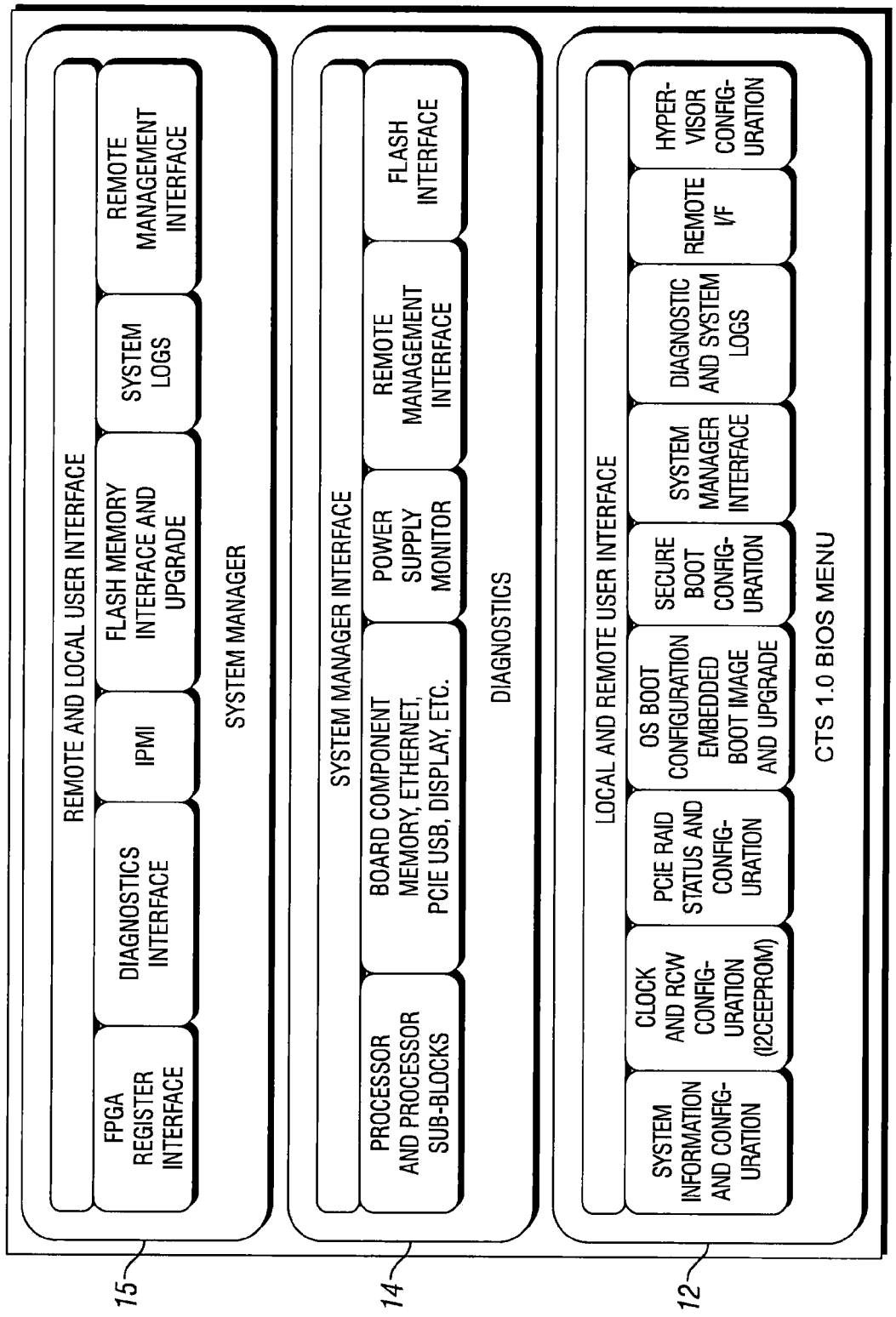
FIG. 8 is a block diagram of the various boot-level software and the functionalities or interfaces thereof that may be utilized in one embodiment of the present invention.

FIG. 8 illustrates a high-level block diagram of boot-level software components in one embodiment. Boot-level software may be all the software that runs before the full OS begins to load. In one embodiment, the Bios Menu 12 is a specialized block sitting on top of the standard u-boot but presenting a status and configuration interface substantially similar to a standard BIOS setup. The BIOS menu interface may be through a monitor connected to the video display connection port 57, to the serial console through UART interface 36, or telnet through the Ethernet 54-55. The boot-level diagnostic software 14 may be utilized by an administrator to gather information regarding the processor 10 or the individual sub-blocks to enable an early detection of a failing system. The boot-level system manager 15 may be responsible for informing the system administrators of the system health or conditions, either passively or actively as requested. In one embodiment, the computer system may be an Industry Standard Server computer, and may boot the OS, such as a Linux OS, using the OS software image stored on the NVM 53, the local Hard Drive 29, a network (through NFS mount), an external storage device on a storage area network (SAN), or a removable media (USB), as desirable.

Figure 9:
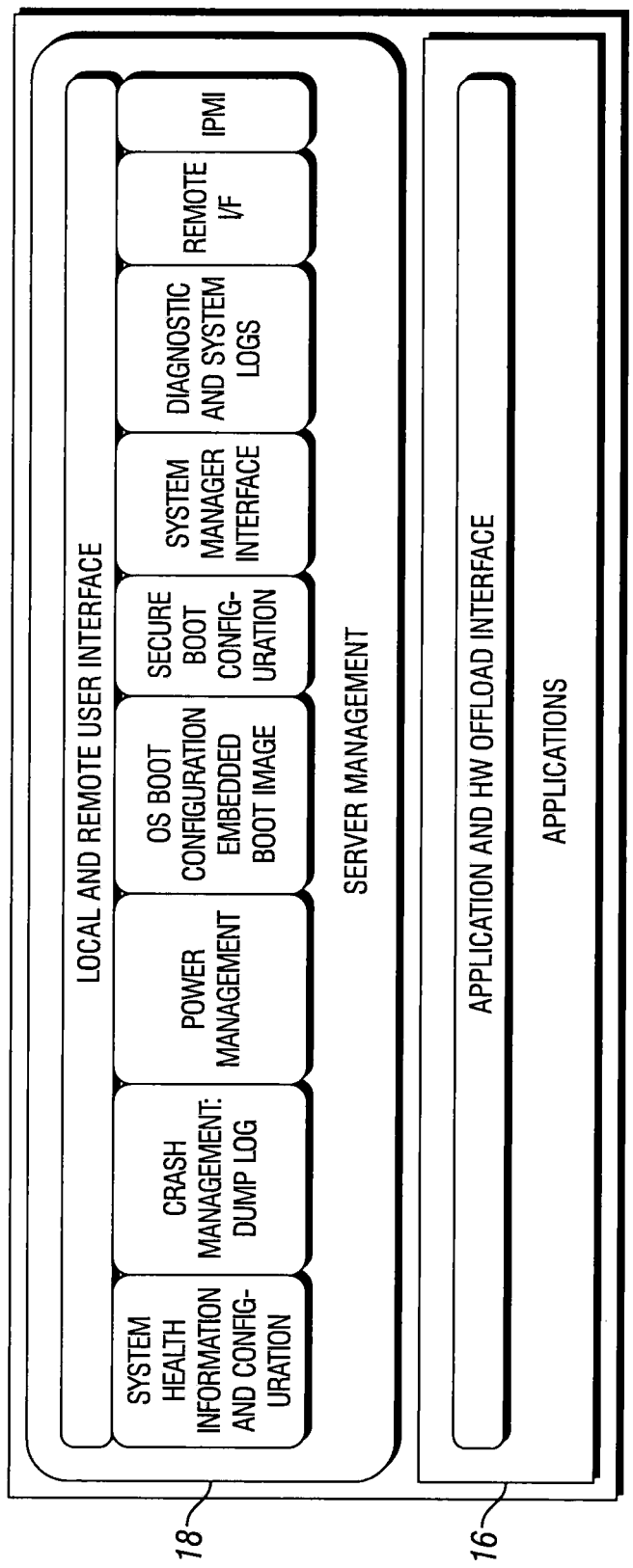
FIG. 9 is a block diagram of the various OS-level software and interfaces that may be utilized by the platform manager in one embodiment of the present invention.

FIG. 9 illustrates a high-level block diagram of OS-level software components in one embodiment. The Application 16, Diagnostics 17, System Management 18, and comprise the various exemplary software that may be executed once the OS/Drivers 19 load up. The operating system may be a Linux OS and the standard OS kernel and Driver software may be open source software. The Application block 16 may comprise standard Linux applications and an application hardware offload interface, allowing applications to utilize one or more offload engines of the processor, thereby increasing the performance of applications while simultaneously reducing the load and thus the power consumption of the processor. In one embodiment, the OS-level system management block 18 enables the administrator to manage the servers, locally or remotely, for example by allowing the administrator to manage all hardware components 20, gather system statistics, run system diagnostics, upgrade firmware, and gather health, condition, or failure information, including information generated by the boot-level system manager 15.

Figure 10:
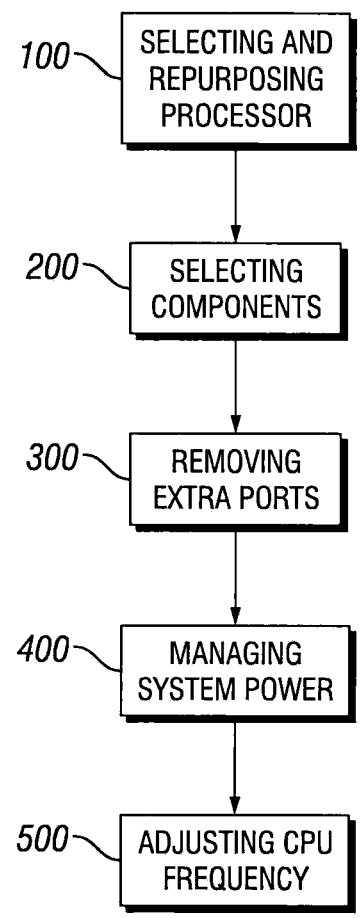
FIG. 10 is a flow chart of various steps that may be utilized to build a preferred embodiment of the present invention.

FIG. 10 illustrates a flow chart steps of which represent one embodiment of the methodology to reducing the power consumption of a computer system or building a low power computer system. The computer system may be a general purpose server computer system. In step 100, the proper processor 30 may first be selected based on predetermined criteria, and then reconfigured, reprogrammed, or repurposed. In one embodiment, the processor may be a communications processor, which may be reconfigured, reprogrammed, or repurposed to function as a server processor. With respect to selecting the processor 30, the predetermined selection criteria may comprise the low power consumption, performance level, memory capacity and bandwidth, Input/Out (IO) bandwidth, and/or offload engines. The selected processors may be tested or analyzed to determine the processor with the highest performance per Watt consumed (Perf./Watt) ratio. In one embodiment, the Perf./Watt test may be the COREMARK® and Phoronix test wherein the processor is tested to generate benchmarks that can be compared to other comparable platforms. The system processor 30 may then be selected based on Perf./Watt ratio, memory capacity and bandwidth, JO bandwidth, and offload engines. In one embodiment, the selected processors may comprise of communications processors capable of matching or outperforming the performance level of competitive server processors, such as the INTEL° XEON® server processor. In one embodiment, the system processor 30 may then be selected as a communication processor having a COREMARK® Perf./Watt ratio comparable to competitive server processors, such as the Intel Xeon server processor, memory capacity of at least 32 GB, IO bandwidth of at least 20 Gb/S, and efficient offload engines.

Figure 11:
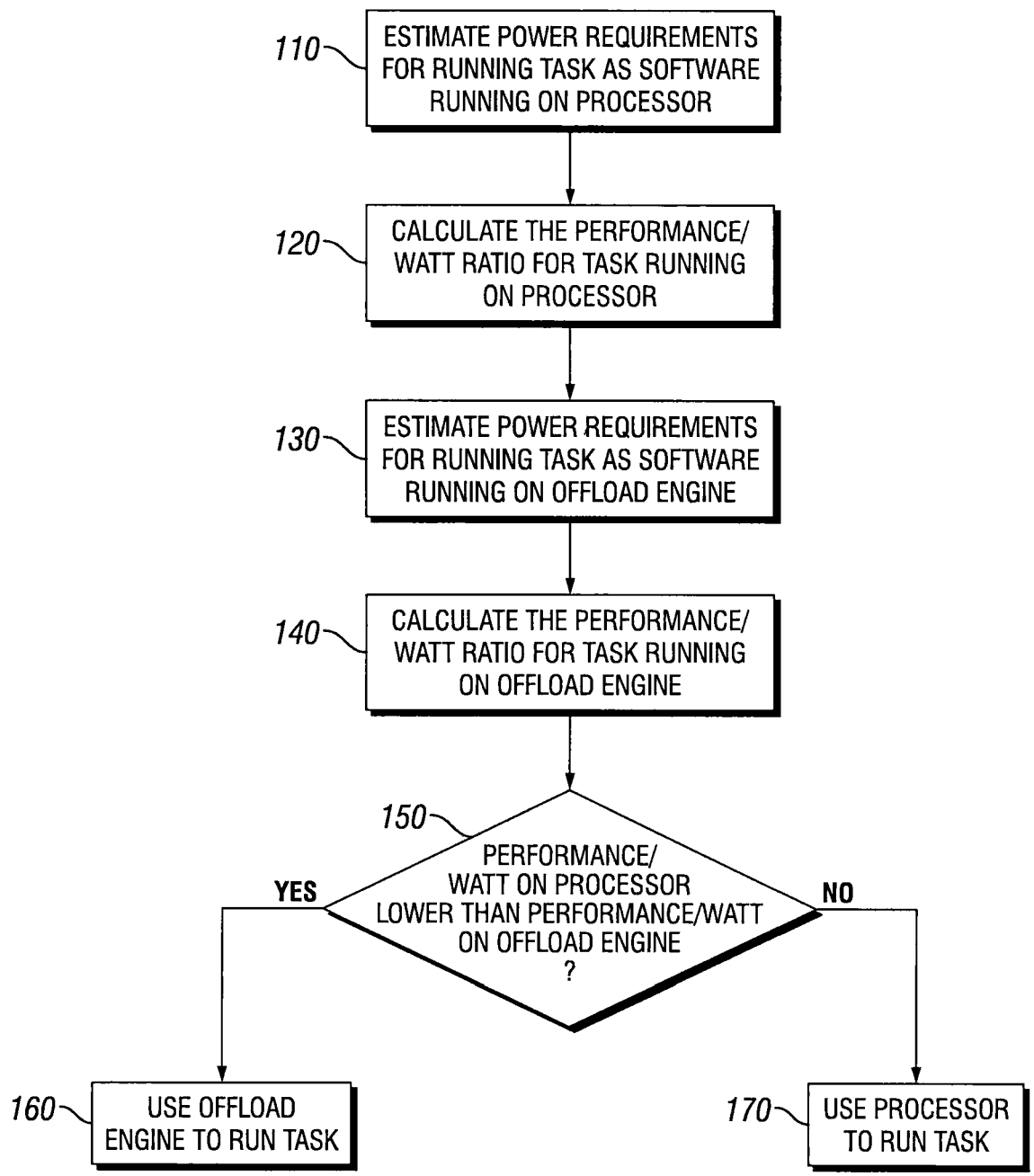
FIG. 11 is a flow chart of various steps that may be involved in repurposing a processor utilized in one embodiment of the present invention.

As illustrated in 11, the processor repurposing step 100 may further comprise of steps that may be utilized in deciding or determining whether to utilize the processor's offload engine in performing a particular task. In the embodiment of FIG. 11, in steps 110-120, the power requirements for running a particular task utilizing the processor 30 may be estimated and the corresponding Perf./Watt ratio for doing so may be calculated. In steps 130-140, similar estimation and calculation may be performed while one or more of the processor's offload engines is utilized to perform the task. In step 150, the calculated Perf./Watt ratio are compared and the task may be performed using the processor 170 or the offload engines 160 according the superior Perf./Watt ratio.

As illustrated in FIG. 10, in step 200, the system hardware components 20 may be selected based on predetermined criteria. In one embodiment, the main system components to be selected may comprise the processor 30, platform manager FPGA 71, PSU 22, power rails 75, Ethernet ports 54-55, NVM 53, display chip(s) 58, clock chip(s) 94, USB hub 59, or PCIe controller 47. In one embodiment, the selection criteria may comprise of performance, power efficiency, and additional component-specific features.

Figure 12:
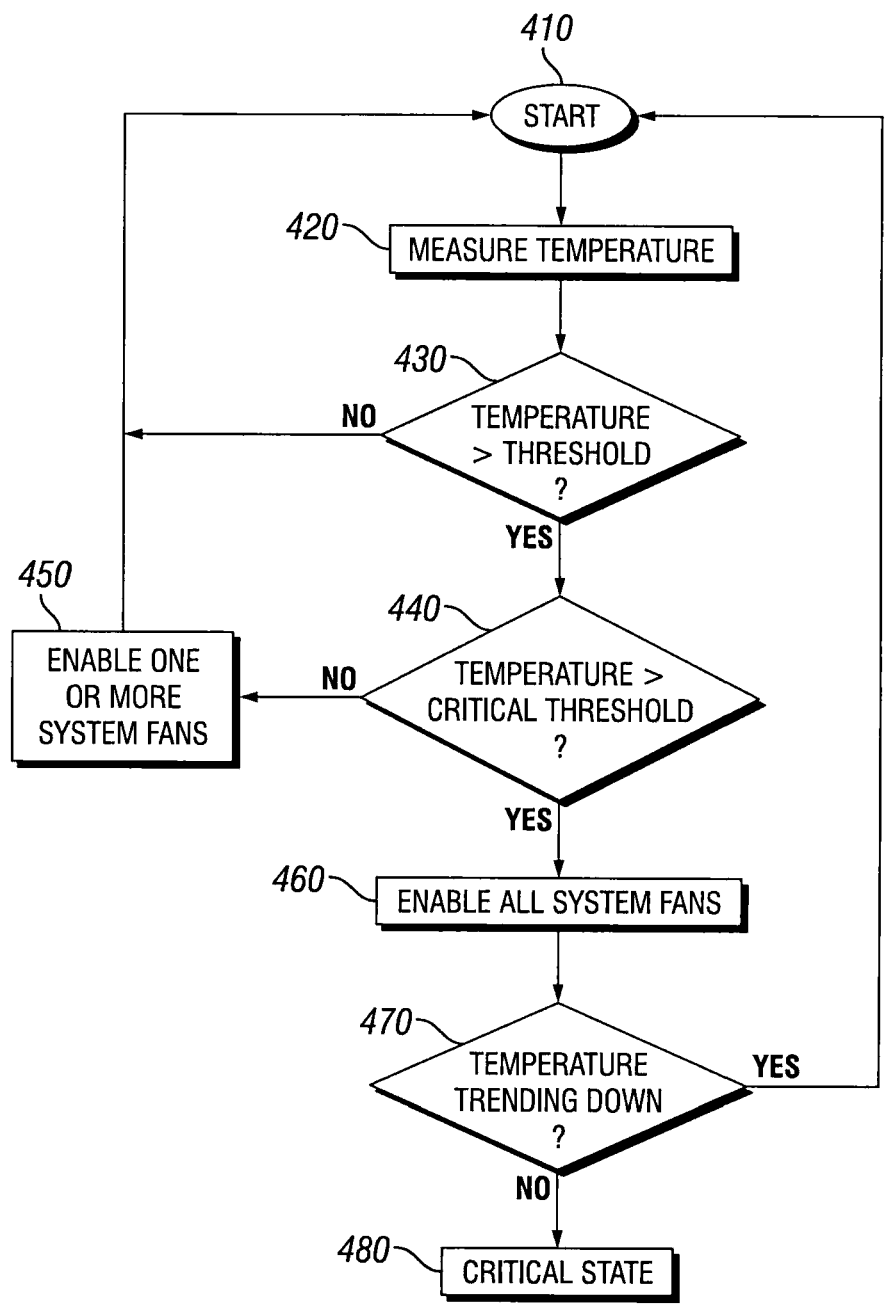
FIG. 12 is a flow chart of the steps performed by the platform manager utilized by one embodiment of the present invention.

As illustrated in FIG. 12, in the managing system power step 400, the system's temperature may be measured 420 at the system's starting state 410, which may be a system ON state with all the system fans disabled or off. If the system's temperature is determined to be under a predetermined threshold level 430, no changes may be made to the system's starting state. If the system's temperature is above the predetermined threshold level but below a critical threshold level 430-440, one or more of the system's fans may be enabled or activated as necessary 450. In one embodiment comprising of six system fans, for example, fans 2, 4, and 6 may be enabled on an even cycle, and otherwise, fans 1, 3, 5 may be enabled as appropriate. If the system temperature is determined to have exceeded a predetermined critical level 440, all of system's fans may be enabled as necessary 460 and if the system's temperature does not begin to decrease 470, the system may be forced to a critical state 480.

The specific structural and functional details of the above-described embodiments are not to be interpreted as limiting, but merely as a representative basis for teaching one skilled in the art to variously employ the present invention.

What is claimed is:

1. A low power consumption general purpose compute server system comprising:
 a motherboard having a plurality of system components connected thereto,
  the plurality of system components comprising:
   a power supply unit comprising a plurality of power-rails to supply electric power to the plurality of system components, wherein the plurality of power-rails are independent power rails each having a voltage independently controllable by the platform manager;
   a peripheral board;
   a main processor comprising:
    a local bus;
    a plurality of main processor cores;
    a plurality of offload engines; and
    a connection fabric connected between the plurality of main processor cores and the plurality of offload engines;
    wherein the main processor is a communications processor system on a chip configured to operate as a general purpose compute server processor by utilizing the plurality of offload engines;
   a platform manager connected to the main processor with the local bus, the platform manager comprising:
    a platform manager processor;
    a plurality of platform manager cores; and a platform manager bus connected between the platform manager processor and the plurality of platform manager cores; and wherein the platform manager is configured by a platform manager software to control the power supplied by the power supply unit to each power rail from the plurality of power rails; and wherein the low power consumption general purpose compute server system is configured through the main processor and the platform manager to consume a maximum of 130 Watts of power while operating under a maximum load.

2. The system of claim 1, wherein the platform manager is based on a field programmable gate array (FPGA).

3. The system of claim 1, wherein the main processor operates at a frequency of 1.5 GHz and consumes less than 85 Watts of power.

4. The system of claim 1, with the main processor having an idle operating temperature of less than 67 degrees Celsius under an ambient temperature of 25.5 degrees Celsius.

5. The system of claim 1, with the main processor having a full-load operating temperature of less than 77 degrees Celsius under an ambient temperature of 25.5 degrees Celsius.

6. The system of claim 2 comprising at least twenty power rails.

7. The system of claim 1, having a form factor enabling the placement of two or more of the systems in a standard server rack.

8. The system of claim 1, wherein the power supply unit has a minimum power efficiency of 90%.

9. The system of claim 2, wherein the platform manager processor is a reduced instruction set computing processor.

10. The system of claim 1, further comprising a non-volatile memory component operably connected between the main processor and the platform manager, the non-volatile memory component utilized to store at least one of: a boot software, board component variables, software configuration variables, and firmware images utilized by the system components.

11. The system of claim 10, further comprising an operating system software which comprises a first diagnostics software and a first system management software, and wherein the boot software comprises a BIOS menu, a second diagnostics software, and a second system management software.

12. The system of claim 2, wherein the platform manager further comprises a memory module connected to the platform manager processor to store and execute the platform manager software.

13. The system of claim 12, wherein the platform manager further comprises:

a set of dedicated registers connected to the platform manager processor; and a set of shared registers connected between the platform manager processor and the main processor.

14. The system of claim 13, wherein the set of shared registers are accessible by the platform manager processor and the main processor and comprise a revision register and a reset request register, and wherein the set of dedicated registers are accessible by the platform manager processor and comprise a control register and a status register.

15. The system of claim 1, further comprising a plurality of system fans, wherein the platform manager is configured to control the plurality of system fans to maintain the system's temperature within a predetermined range.

* * * * *